US008965748B2

(12) United States Patent
Iyengar et al.

(10) Patent No.: US 8,965,748 B2
(45) Date of Patent: Feb. 24, 2015

(54) DATA CENTER EFFICIENCY ANALYSES AND OPTIMIZATION

(71) Applicant: International Business Machines Corporation, Armonk, NY (US)

(72) Inventors: Madhusudan K. Iyengar, Woodstock, NY (US); Robert R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 13/708,993

(22) Filed: Dec. 8, 2012

(65) Prior Publication Data

US 2013/0096905 A1 Apr. 18, 2013

Related U.S. Application Data

(63) Continuation of application No. 13/045,474, filed on Mar. 10, 2011, now abandoned.

(51) Int. Cl.
  G06F 17/50 (2006.01)
  G06Q 10/04 (2012.01)
(52) U.S. Cl.
  CPC ............ *G06F 17/5009* (2013.01); *G06Q 10/04* (2013.01)
  USPC .......................................................... 703/21
(58) Field of Classification Search
  CPC .................................................... G06F 17/5009
  USPC .......................................................... 703/21
  See application file for complete search history.

(56) References Cited

U.S. PATENT DOCUMENTS

| 6,945,058 B2 | 9/2005 | Bash et al. ........................ 62/89 |
| 7,135,956 B2 | 11/2006 | Bartone et al. ................ 340/3.9 |
| 7,210,048 B2 | 4/2007 | Bodas ............................ 713/320 |

(Continued)

FOREIGN PATENT DOCUMENTS

| EP | 2098956 | 9/2009 | ............... G06F 9/50 |

OTHER PUBLICATIONS

Madhusudan Iyengar, Roger Schmidt, "Analyitical Modeling for Thermodynamic Characterization of Data Center Cooling Systems" ASME Journal of Electronic Packaging, vol. 131, Issue 2, 2009, 9 pages.*
Torres et al., "Tailoring Resources: The Energy Efficient Consolidation Strategy Goes Beyond Virtualization", International Conference on Automonic Computing, pp. 197-198 (2008).

(Continued)

*Primary Examiner* — Dwin M Craig
(74) *Attorney, Agent, or Firm* — Margaret A. McNamara; Ido Tuchman

(57) ABSTRACT

Method, system and computer program product for estimating the overall energy efficiency of a data center over a period of time. In one embodiment, a computer processor coupled to computer readable memory is configured to receive time parameters indicating the period of time over which the overall energy efficiency of the data center is to be estimated, receive component parameters indicating the performance characteristics of data center components and the operational interactions between the data center components, simulate the operation and interaction of the data center components based, at least in part, on the component parameters for the period of time over which the energy efficiency is estimated, and output results of the simulation to estimate the overall energy efficiency of the data center.

22 Claims, 7 Drawing Sheets

(56) References Cited

U.S. PATENT DOCUMENTS

| | | | |
|---|---|---|---|
| 2008/0174954 A1* | 7/2008 | VanGilder et al. | 361/687 |
| 2008/0301473 A1 | 12/2008 | Perez et al. | 713/300 |
| 2009/0231152 A1* | 9/2009 | Tung et al. | 340/660 |
| 2009/0268404 A1 | 10/2009 | Chu et al. | 361/696 |
| 2010/0037071 A1 | 2/2010 | Chang | 713/310 |
| 2010/0049494 A1* | 2/2010 | Radibratovic et al. | 703/13 |
| 2011/0144932 A1* | 6/2011 | Alles | 702/61 |

OTHER PUBLICATIONS

Valancius et al., "Greening the Internet with Nano Data Centers", pp. 37-48, CoNEXT'09, Dec. 1-4, 2009, Rome, Italy (2009).

Raghavendra et al., "No 'Power' Struggles : Coordinated Multi-level", pp. 48-59, ASPLOS'08 Mar. 1-5, 2008, Seattle, Washington, USA (2008).

* cited by examiner

US 8,965,748 B2

DATA CENTER EFFICIENCY ANALYSES AND OPTIMIZATION

CROSS-REFERENCE TO RELATED APPLICATIONS

This is a Continuation application to U.S. patent application Ser. No. 13/045,474 entitled "DATA CENTER EFFICIENCY ANALYSES AND OPTIMIZATION", filed Mar. 10, 2011, which application is incorporated herein by reference.

BACKGROUND

The present invention relates to tools for estimating and optimizing the cooling energy consumption of an existing or new data center based on, for example, various parameters, such as component selection, geographic location, operation time and/or data center footprint.

A data center is a facility for operating a large number of servers. Servers typically include computational hardware, such as circuit boards, memory and computer processors. The servers are generally installed in racks or cabinets. Each cabinet typically holds approximate 40 servers. There may be hundreds of such cabinets in a data center floor.

Data centers often consume large amounts of electricity and generate a lot of heat. The generated heat must be dissipated from the data center in order to meet the operational requirements of the server components. Various cooling equipment can be employed in a data center to dissipate the generated heat. Such solutions include, but are not limited to, air conditioners, free cooling units, pressurized air plenums, chilled water, water pumps, chiller plants, cooling towers, water side economizers, and server rack fans.

Determining which heat dissipation solutions are the most energy efficient for a particular data center can be a difficult endeavor. Furthermore, external factors, such as climate conditions and energy costs at the data location can influence the best cooling strategy for a data center.

SUMMARY

One example aspect of the invention is a method for estimating the overall energy efficiency of a data center over a period of time by a computer. The method includes receiving one or more time parameters indicating the period of time over which the overall energy efficiency of the data center is estimated over which the overall energy efficiency of the data center is estimated. A plurality of component parameters is also received. The component parameters indicate performance characteristics of data center components and operational interactions between the data center components. The method further includes simulating the operation and interaction of the data center components based, at least in part, on the component parameters for the period of time over which the energy efficiency is estimated, and outputting results of the simulation. The results indicate the overall energy efficiency of the data center.

Another example aspect of the invention is a system for estimating the overall energy efficiency of a data center over a period of time. The system includes computer readable memory and a computer processor. The computer is configured to receive time parameters indicating the period of time over which the overall energy efficiency of the data center needs is estimated, receive component parameters indicating the performance characteristics of data center components and the operational interactions between the data center components, simulate the operation and interaction of the data center components based, at least in part, on the component parameters for the period of time over which the energy efficiency is estimated, and output results of the simulation to estimate the overall energy efficiency of the data center.

Yet a further example aspect of the invention is a computer program product for estimating the overall energy efficiency of a data center over a period of time. The computer program product includes computer readable program code configured to: receive one or more time parameters, the time parameters indicating the period of time over which the overall energy efficiency of the data center needs is estimated, receive a plurality of component parameters, the component parameters indicating the performance characteristics of data center components and the operational interaction between the data center components, simulate the operation and interaction of the data center components based, at least in part, on the component parameters for the period of time over which the overall energy efficiency is estimated, and output results of the simulation to indicate the overall energy efficiency of the data center.

DETAILED DESCRIPTION

The present invention is described with reference to embodiments of the invention. Throughout the description of the invention reference is made to FIGS. 1-7.

As discussed in detail below, embodiments of the present invention can help estimate and optimize the cooling energy consumption of an existing or new data center. The tool user may specify various parameters for the data center, such as cooling components, geographic location, operation time and/or data center footprint. The tool allows the user to simulate the energy consumption of a specified data center and help the user converge on an optimal energy consumption configuration of the data center. For example, the user may simulate various data center configurations and conduct a comparative analysis on the simulation results to arrive that the most energy efficient data center configuration.

Figure 1:
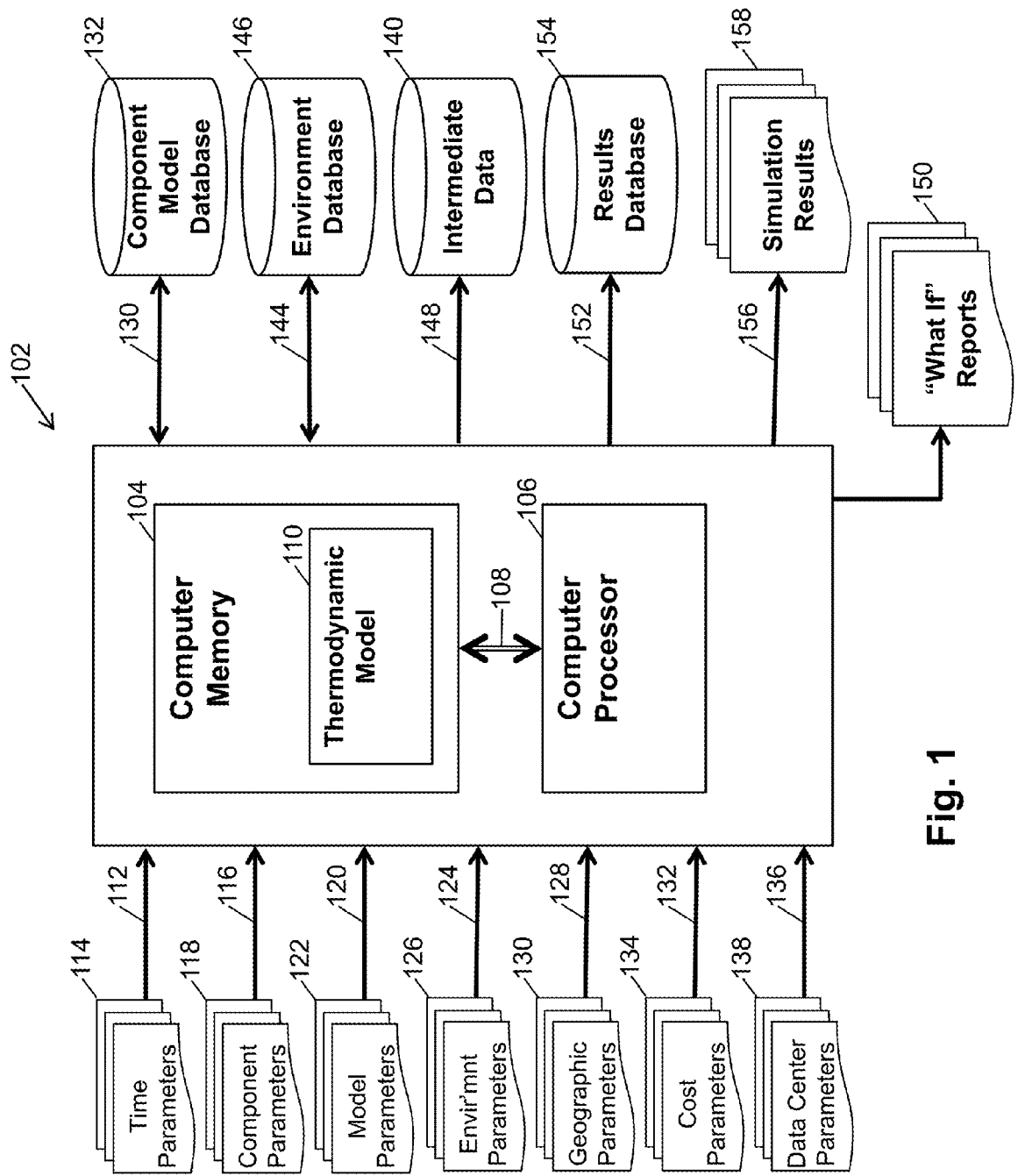
FIG. 1 shows an example computer system for estimating the energy efficiency of a data center over a period of time, as contemplated by an embodiment of the present invention.

FIG. 1 illustrates an example computer system 102 for estimating the overall energy efficiency of a data center over a period of time contemplated by the present invention. It is noted that the computer system shown in FIG. 1 is just one example of various arrangements of the present invention and should not be interpreted as limiting the invention to any particular configuration.

The computer system 102 presented in FIG. 1 includes a computer processor 106 coupled to computer readable memory 104. The computer processor 106 is configured to read and write data 108 in the computer memory 104.

The computer system 102 is configured to receive input data from a user or another computer system (illustrated by arrows 112, 116, 120, 124, 128, 132, and 136). Typically, receiving input data from a user is performed through a graphical user interface (GUI) shown on a computer display and one or more input devices. Some common input devices utilized in the art are computer keyboards, computer mice, and touch-screen displays. Receiving data from another computer system is generally accomplished through a network connection that links the data receiving and sending computer systems.

The computer system 102 is also configured to display output data to a user and/or send the output data to another computer system (illustrated by arrow 156). Typically, displaying output data to a user is done through a computer display or a printer. Sending data to another computer system is generally done through a network connection that links the receiving and sending computer systems.

The computer system 102 shown in FIG. 1 is additionally configured to communicate with several databases in a way that allows the computer processor 106 to save data in the databases, query the databases for previously saved data, and receive data from the databases (illustrated by arrows 140, 144, 148, and 152). In general, a database can be any persistent computer storage that allows the computer processor to write and read data. Such computer storage can be implemented as part of the computer system itself; for example, in the form of a hard drive that is connected to the rest of the components of the computer system 102 through a SATA bus. The computer storage can also be implemented, for example, as network-attached storage that is linked via a network connection to the computer system 102.

The computer system 102 is configured to receive a number of parameters 114, 118, 122, 126, 130, 134, and 138 that are utilized to estimate the energy efficiency of a data center. It should be noted that not all parameters illustrated in FIG. 1 may be necessary for the computer system to estimate the data center energy efficiency.

Time parameters 114 indicate the period of time over which the overall energy efficiency of the data center is estimated. An example of time parameters may be a range of dates, such as from January 1 to December 31, or a single time period, such as six months or one year. In the case when input data is provided by a user, the time parameters can be typed on a computer keyboard or selected on the computer display utilizing a GUI element such as a drop-down list or a graphical calendar.

The component parameters 118 describe the type of individual data center components, the performance characteristics of these data center components, and the operational interactions between them. Component parameters that describe the type of individual data center components are, for example, computer server, computer room air conditioner (CRAC), or chiller plant. Examples of performance characteristic parameters that further describe those same example data center components are the heat output and the electrical power consumption of the computer server for a given time period, the cooling capacity and electrical power consumption of the CRAC for a given time period, and the cooling capacity and electrical or gas power consumption of the chiller plant for a given time period. Finally, examples of component parameters that describe operational interactions between the same example data center components may be a parameter indicating that the computer server is being cooled by the CRAC and the CRAC is connected to the chiller plant.

It should be noted that multiple data center components of the same type may be described by the component parameters by either providing separate parameters for each or indicating the number of components of the given type. Thus, for example, the component parameters may describe thirty identical computer servers that are cooled by two CRACs connected to a single chiller plant. In an embodiment of the invention where the component parameters are provided by a user, the user may utilize a GUI to describe individual data center components by selecting or typing each component type, selecting or typing the performance characteristics of each component, and indicating interactions between components.

As mentioned, in the invention embodiment illustrated in FIG. 1, the component parameters 118 that describe the type, performance characteristics, and operational interactions of the data center components may be provided separately for each data center component or type of component. Another option illustrated in FIG. 1 is to provide a number of model parameters 122 that describe predefined models of data center components which can be referenced 140 by the computer processor 106 from a component model database 142. The computer processor 106 can retrieve the component parameters associated with the predefined data center component models stored in the component model database 142. For example, the component model database 142 may contain information about the power consumption and cooling capacity of three models of CRACs (i.e., model A, B, and C). In an embodiment where the input data is provided by a user, the user may select model B and indicate that two components of the given type are present in the data center. The computer processor 106 receives 120 the selection as model parameters 122 and uses it to lookup 140 the component parameters for CRAC model B in the component model database 142.

The embodiment illustrated in FIG. 1 also envisions that the computer system 102 is configured to receive 124 environment parameters 126 that describe characteristics of the ambient environment in which the data center operates. Such environmental characteristics are, for example, air temperature, air humidity, and atmospheric pressure. The environment parameters 126 may describe environment characteristics for the overall time period over which the energy efficiency is estimated, as indicated by the time parameters 114. For example, the environment parameters 126 may specify the average yearly air temperature when the energy efficiency is estimated for one year. Alternatively, the environment parameters 126 may describe environment characteristics for a number of discrete intervals within the time period indicated by the time parameters 114. For example, environment parameters 126 may specify the average monthly air temperature for each month of the year when the energy efficiency is again estimated for one year.

The system 102 may include an environment database 146 storing information about environmental characteristics for a plurality of geographic locations and time periods. Furthermore, the computer processor 106 may receive geographic parameters 130 indicating the geographic location of the data center under analysis. The computer processor 106 may query the environment database 146 based on the geographical parameters 130 and the time parameters 114 to receive the environment parameters 126.

The system 102 may receive a plurality of cost parameters 134 indicating unit costs of energy resources consumed by the data center. These energy resources may include electrical power, natural gas, and/or water utilized by the data center.

The system 102 may receive a plurality of data center parameters 138. The data center parameters 138 may include the number of data center buildings, number of floors, number of server rooms, size of server rooms, maximum server room temperature, and operating hours of the data center.

The computer processor 106 is configured to simulate the operation and interaction of the data center components based, at least in part, on the component parameters for the period of time over which the energy efficiency is estimated. The simulation results 158 may be output to a user terminal or a results database 154. The results database 154 stores the results of a plurality of simulations of the operation and interaction of the data center components.

To facilitate datacenter simulation, an intermediate data 150 may be stored by the computer processor 106 in computer memory. The intermediate data 150 includes simulation results per data center component per time interval in different time intervals within the time period over which overall energy efficiency is estimated.

In one embodiment, the computer processor 106 is configured to generate a thermodynamic model 110 of heat exchanges resulting from the operational interaction between the data center components and heat exchanges between the data center components and the ambient environment. The thermodynamic model 110 is utilized to estimate energy consumption by the data center components. Simulating the operation and interaction of the data center components may further include using one or more of the cost parameters 134.

In one embodiment of the invention, the energy consumption of a data center facility is calculated by the computer processor 106 using various approximation methods. For example, each coolant loop can be assumed to have a particular relationship between pressure and flow. Electro-mechanical inefficiencies are factored to estimate the pump and/or blower power consumption. Regression models may be used for chiller plants to predict the compressor power consumption under the calculated pressure and flow conditions. Weather data can be averaged over various granularities of a given year. Alternatively, hour-by-hour weather data calculations can be performed using commercially available software known to those skilled in the art.

Using the simulation results 158, the computer processor 106 can determine an optimal data center configuration based on the data center parameters 136. The computer processor 106 is further configured to store the results of the simulation of the operation and interaction of the data center components in the results database 154. The computer processor 106 can further receive simulation reporting parameters indicating simulations of the operation and interaction of the data center components. The results database 154 may be queried based on the simulation reporting parameters to retrieve the results of one or more simulations, and display the retrieved results.

The system 102 may also be configured to generate "what if" reports 160. The "what if" reports 160 allow the user to explore proposed changes to the data center and determine if the changes would improve the data center's overall energy efficiency. For example, by adjusting the component parameters 118, model parameters 122, environment parameters 126, geographic parameters 130, cost parameters 134, and data center parameters 138, the user can simulate proposed changes to an existing or new data centers and quickly determine if such changes would be advantageous to the data center's design.

Figure 2:
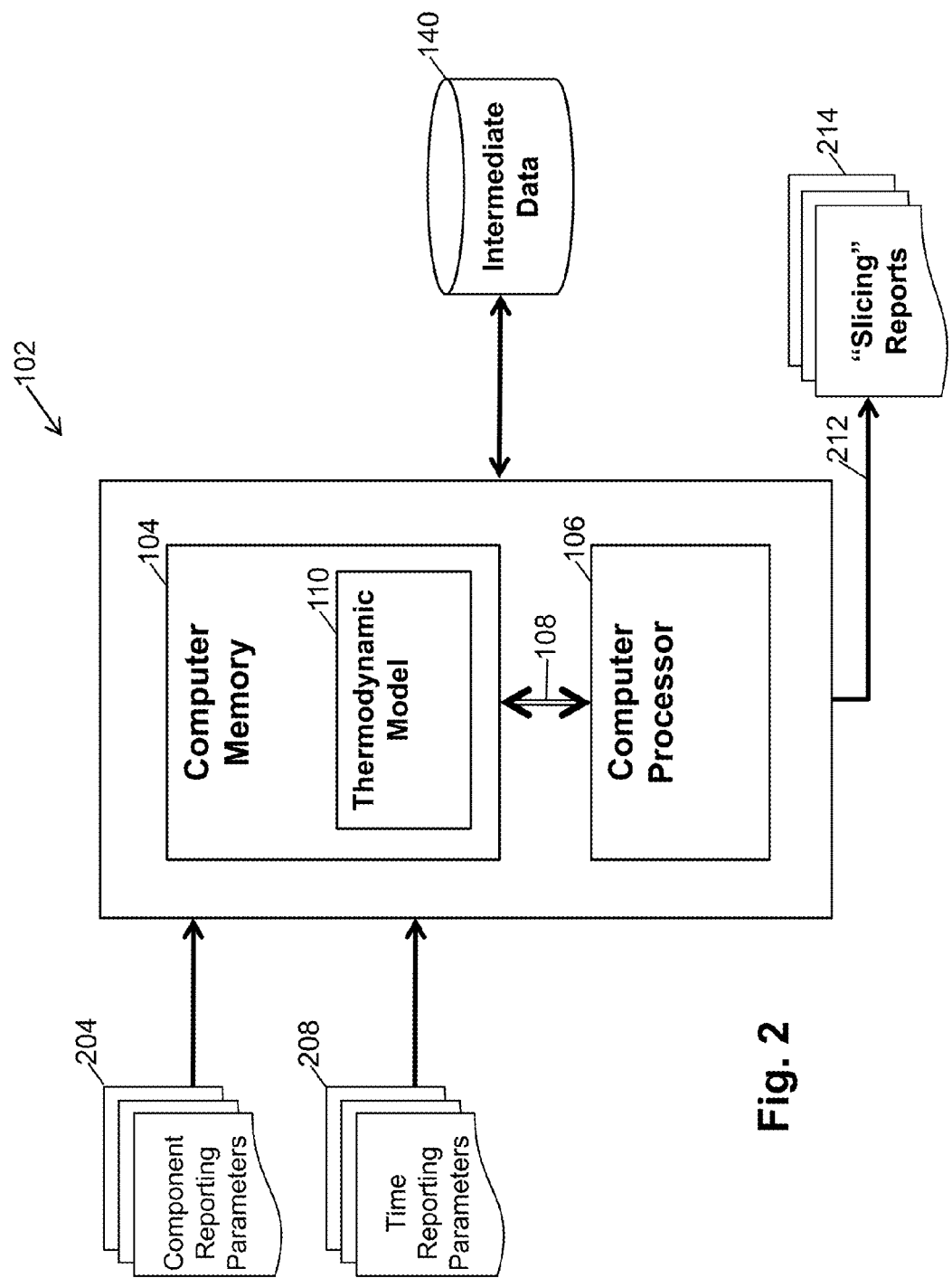
FIG. 2 shows the computer system embodiment of FIG. 1 configured to provide reports of data center energy efficiency estimates by component and time period.

Turing to FIG. 2, a further embodiment of the invention is shown configuration of the system 102 for generating slicing reports 214. As discussed below, the slicing reports 214 present simulation results focused on particular data center components and/or parameters.

In this embodiment, component reporting parameters are received by the computer processor 106. The reporting parameters 204 indicate one or more data center components to be included in the slicing report 214. The processor 106 may also receive time reporting parameters 208. The time reporting parameters 208 indicate one or more time intervals within the time period over which overall energy efficiency is estimated.

The computer processor 106 queries the intermediate data 150 based on the reporting parameters 204 and/or the reporting parameters 208 for matching reports. As discussed above, the intermediate data 150 includes simulation results per data center component per time interval in different time intervals within the time period over which overall energy efficiency is estimated. Intermediate data 150 matching the input reporting parameters 204 and/or the reporting parameters 208 is output to the slicing reports 214.

Figure 3:
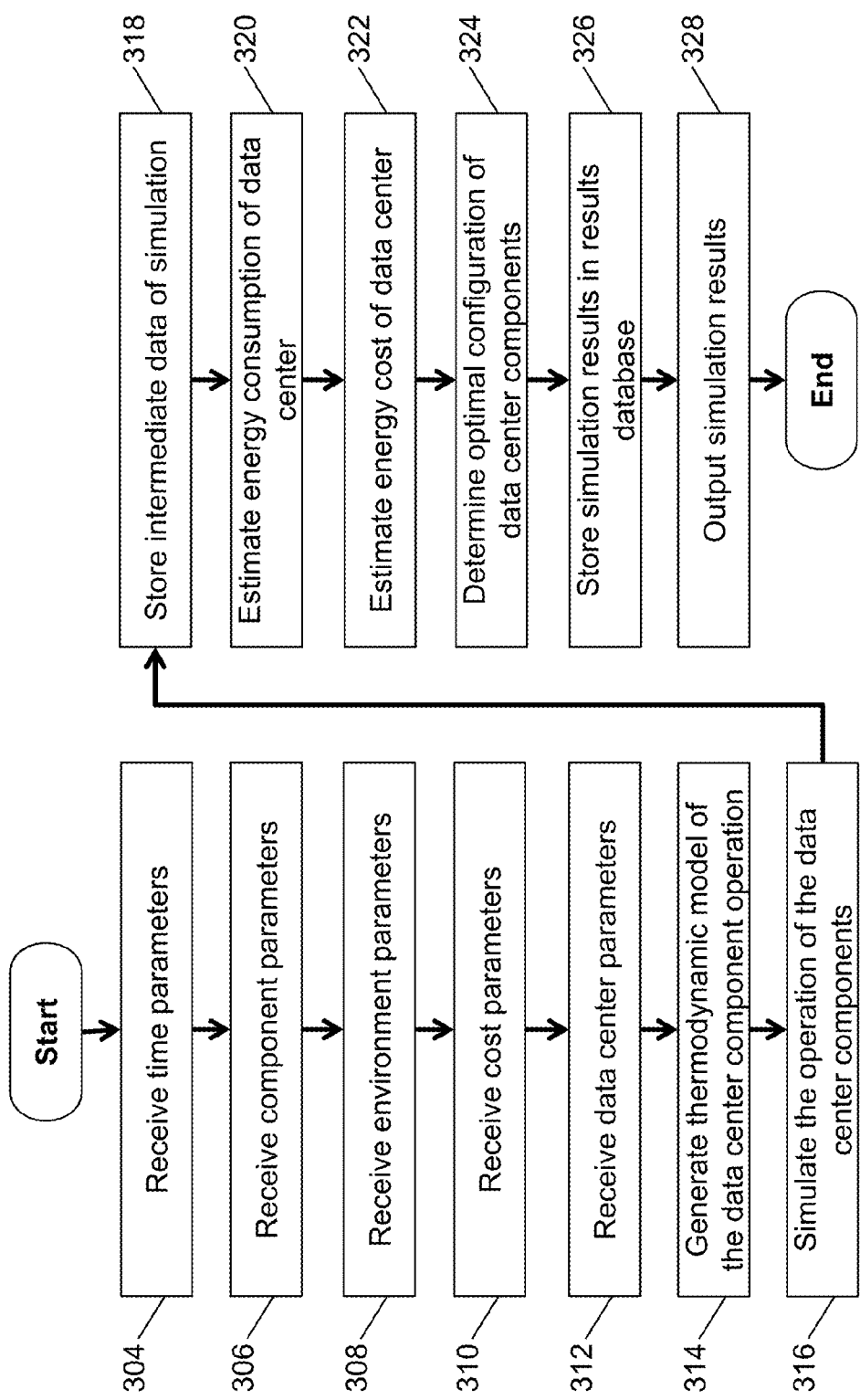
FIG. 3 shows an example flowchart for estimating the energy efficiency of a data center over a period of time, as contemplated by an embodiment of the present invention.

FIG. 3 shows an example flowchart for estimating the energy efficiency of a data center over a period of time, as contemplated by an embodiment of the present invention. As discussed in more detail below, the flowchart may be embodied as computer code in non-transient computer memory, as hardware, or a combination thereof.

Process flow begins at receiving operation 304. During this operation, one or more time parameters are received by a computer processor. The time parameters indicate the period of time over which the overall energy efficiency of the data center is estimated. After receiving operation 304 is completed, control passes to receiving operation 306.

At receiving operation 306, a plurality of component parameters are received. The component parameters indicate performance characteristics of data center components and operational interactions between the data center components. The performance characteristics of the data center components may include electrical power consumption, natural gas consumption, water consumption, heat generation, heat dissipation, air volume, air pressure, water volume, water pressure, maximum area that can be cooled, and/or maximum number of floors that can be serviced.

In one embodiment, component parameters are stored and retrieved from a database of data center types. The database includes information about the performance characteristics and operational interactions of data center components for a plurality of data center types. In this embodiment, receiving operation 306 may include receiving one or more data center type parameters. The data center type parameters indicate a data center type, with the data center type comprising a plurality of data center components configured to operate and interact together. The database of data center types is queried based on the received data center type parameters, and the resulting query results from the database include component parameters based on the data center type parameters. After receiving operation 306 is completed, control passes to receiving operation 308.

At receiving operation 308, a plurality of environment parameters is received. The environment parameters indicate characteristics of an ambient environment over one or more time intervals within the period of time over which the overall energy efficiency is estimated. The characteristics of the ambient environment may be, for example, air temperature, air humidity, dew point, atmospheric pressure, and/or precipitation. After receiving operation 308 is completed, control passes to receiving operation 310.

At receiving operation 310, a plurality of cost parameters is received. The cost parameters indicate unit costs of energy resources consumed by the data center. The energy resources may be, for example, electrical power, natural gas, and/or water. After receiving operation 310 is completed, control passes to receiving operation 312.

At receiving operation 312, a plurality of data center parameters is received. The data center parameters may include, for example, the number of data center buildings in the data center, the number of floors in the data center, the number of server rooms in the data center, the size of server rooms in the data center, the maximum server room temperature in the data center, and/or operating hours of data center. After receiving operation 312 is completed, control passes to generating operation 314.

At generating operation 314, a thermodynamic model of heat exchanges is generated by a computer processor. The thermodynamic model describes the operational interactions between the data center components, and heat exchanges between the data center components and the ambient environment. After generating operation 314 is completed, control passes to simulating operation 316.

Next, at simulating operation 316, the operation and interaction of the data center components are simulated by the computer processor based, at least in part, on the component parameters for the period of time over which the energy efficiency is estimated. After simulating operation 316 is completed, control passes to storing operation 318.

At storing operation 318, intermediate data from simulating the operation and interaction of the data center components is stored in computer-readable memory. The intermediate data includes simulation results per data center component per time interval in time intervals within the time period over which overall energy efficiency is estimated. After storing operation 318 is completed, control passes to estimating operation 320.

At estimating operation 320, the thermodynamic model generated at operation 314 is utilized to estimate energy consumption by the data center components. At estimating operation 322, the simulation results are used to estimate the energy cost of the data center based in part on the received cost parameters at operation 310. The simulation operation 316 may include determining operation 324. During this operation, an optimal data center configuration based on the data center parameters is determined.

Next, at storing operation 326, the results of the simulation of the operation and interaction of the data center components are stored in a results database. The results database is configured to contain the results of a plurality of simulations of the operation and interaction of the data center components. After storing operation 326 is completed, control passes to outputting operation 328.

At outputting operation 328, the results of the simulation are output. The results can indicate the overall energy efficiency of the data center. In one embodiment, the outputting operation 328 may include receiving one or more simulation reporting parameters indicating one or more simulations of the operation and interaction of the data center components, querying the results database based on the simulation reporting parameters to retrieve the results of one or more simulations, and displaying the retrieved results of the one or more simulations. In other embodiments for the invention, results from the simulation may indicate the total energy consumption for the data center, energy consumption per data center component, total energy consumption for the data center per time interval in a plurality of time intervals within the time period over which overall energy efficiency is estimated, energy consumption per data center component per time interval in a plurality of time intervals within the time period over which overall energy efficiency is estimated, average server room temperature for the time period over which overall energy efficiency is estimated, and/or maximum server room temperature for the time period over which overall energy efficiency is estimated.

Figure 4B:
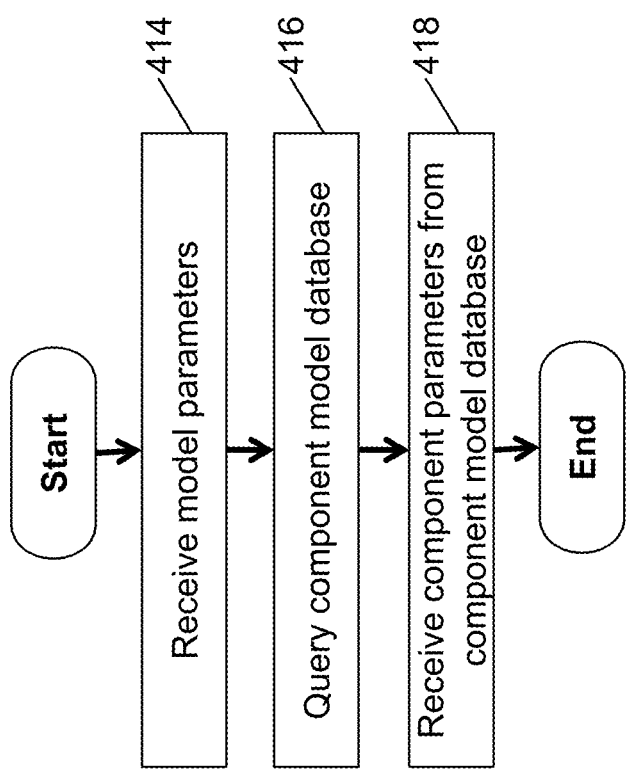
FIGS. 4A and 4B show two possible enhancements to the flowchart of FIG. 3 where an environment database and a component model database are utilized to receive the environment parameters and the component parameters, respectively.
Figure 4A:
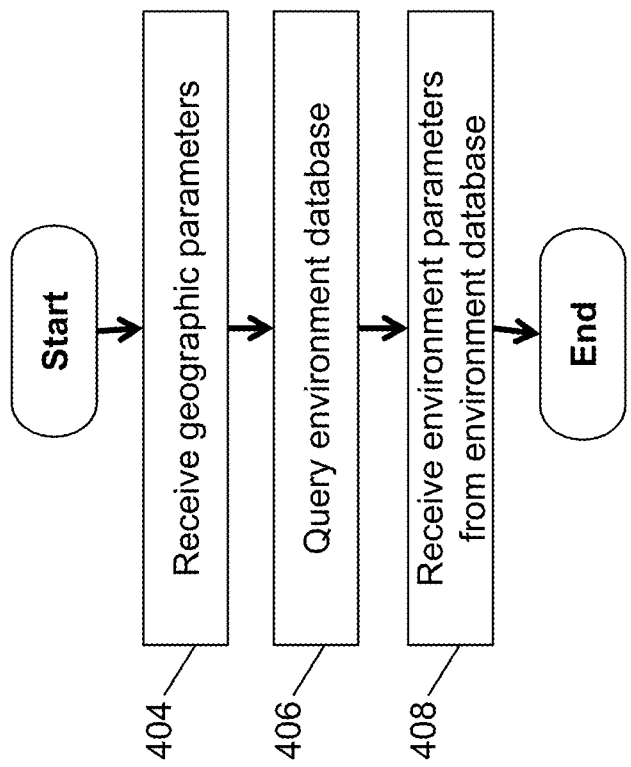

As discussed above, the simulation may incorporate geographic the geographic location of the data center. In FIG. 4A, the steps for such an embodiment are shown.

At receiving operation 404, one or more geographical parameters are received. The geographical parameters include an indication of the geographic location of the data center. After receiving operation 404 is completed, control passes to querying operation 406.

At querying operation 406, a database of environmental information is queried based on the geographical parameters and the period of time over which the overall energy efficiency is estimated. The database of environmental information includes information about environmental characteristics for a plurality of geographic locations over at least one time interval. After querying operation 406 is completed, control passes to receiving operation 408.

At receiving operation 408, the environmental parameters are received from the database of environmental information based on the geographical parameters. As discussed above, the environment information can describe characteristics of the ambient environment in which the data center operates. Next, the process may proceed to simulating operation 316 (see FIG. 3) where the operation and interaction of the data center components are simulated by the computer processor based, at least in part, on the received environmental information.

In one embodiment of the invention, the processor may utilize predefined models of data center components to be simulation. FIG. 4B shows the steps for such an embodiment.

At receiving operation 414 one or more model parameters are received by the processor. The model parameters may indicate a data center component model. Moreover, the data center component model may include a plurality of data center components configured to operate and interact together. The data center components may include, for example, an air conditioner (AC), computer room air conditioner (CRAC), free cooling unit (FCU), pressurized air plenum, chilled water (CHW) pipe, CHW pipe valve, CHW pump, boosted cold water (BCW) pump, chiller plant, chiller compressor, cooling tower, water side economizer, computer server, network switch, computer server rack, computer server rack fan, uninterruptible power supply (UPS), and/or electrical co-generation system. After receiving operation 414 is completed, control passes to querying operation 416.

At querying operation 416, a database of data center component models is queried based on the model parameters. The database of data center component models includes information about performance characteristics and operational interactions of data center components for a plurality of data center component models. After querying operation 416 is completed, control passes to receiving operation 418.

At receiving operation 418, the component parameters are received from the database of data center component models based on the model parameters. Next, the process may proceed to simulating operation 316 (see FIG. 4) where the operation and interaction of the data center components are simulated by the computer processor based, at least in part, on the received component parameters.

Figure 5B:
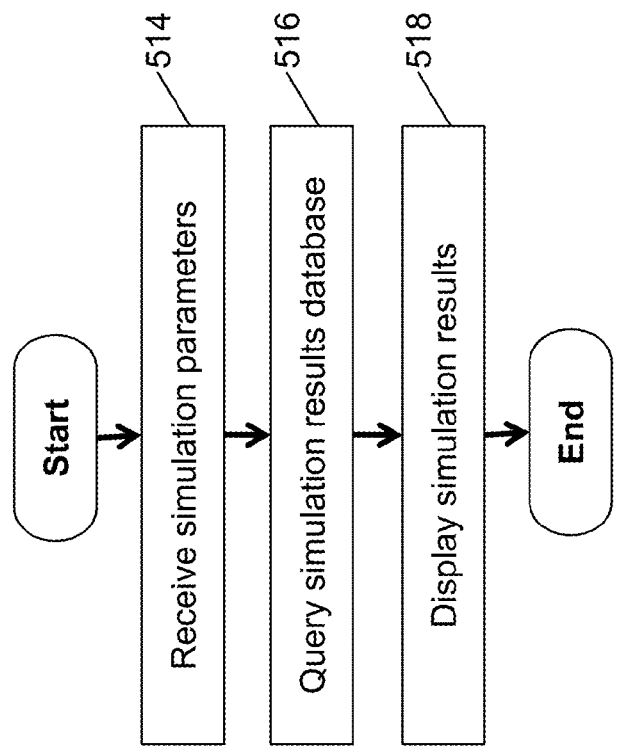
FIGS. 5A and 5B show two possible enhancements to the flowchart of FIG. 3 providing reports of data center energy efficiency estimates by component and time period or for multiple simulation runs.
Figure 5A:
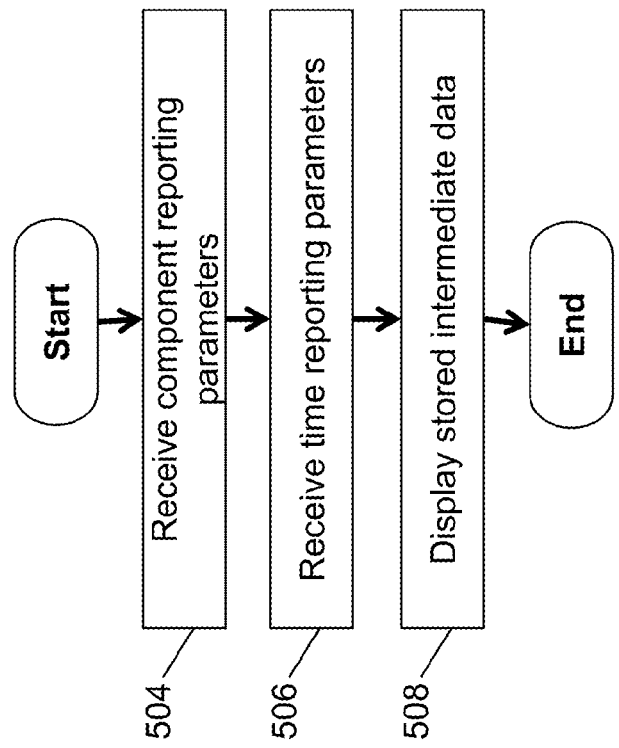

Turning now to FIG. 5A, a further embodiment of the simulation process is shown. The embodiment allows users to display stored intermediate data of the simulation data for a simulation time and for particular data center components. The process includes receiving operation 504, in which component reporting parameters are received by the computer processor; the component reporting parameters indicate one or more data center components. After receiving operation 504 is completed, control passes to receiving operation 506.

At receiving operation 506, time reporting parameters are received from the user. The time reporting parameters indicate one or more time intervals within the time period over which overall energy efficiency is estimated. Next, control passes to displaying operation 508.

At displaying operation 508, the stored intermediate data is displayed for the received component reporting parameters and the received time reporting parameters.

FIG. 5B shows a further embodiment of the invention for displaying saved data center simulation results. As mentioned above, the data center simulation results may be saved in a results database 154 (see FIG. 1). Thus, the results database contains the results of a plurality of simulations of the operation and interaction of the data center components.

The process includes receiving operation 514, where simulation reporting parameters are received. The simulation reporting parameters indicate one or more simulations of the operation and interaction of the data center components. After receiving operation 514 is completed, control passes to querying operation 516.

At querying operation 516, the results database is queried based on the simulation reporting parameters. As a result, one or more simulations results are retrieved from the results database. After querying operation 516 is completed, control passes to displaying operation 518.

At displaying operation 518, the retrieved results of the simulations as displayed. As mentioned above, displaying output data to a user is typically performed through a computer display or a printer. Alternatively, the results may be sent over a network as data packets.

Figure 6:
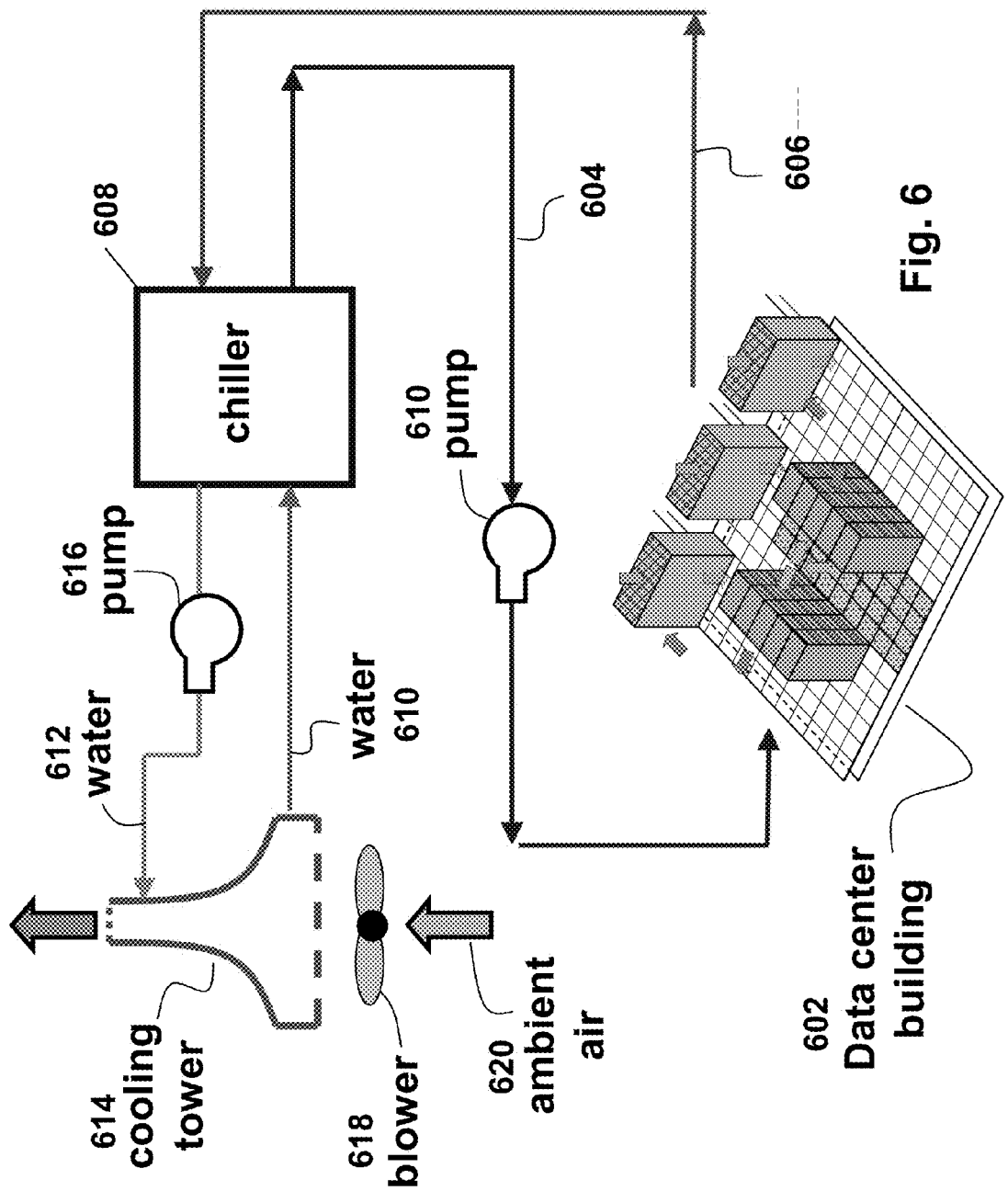
FIG. 6 shows several typical data center components that may be simulated by an embodiment of the present invention to estimate the energy efficiency of a data center over a period of time.

FIG. 6 shows an example schematic of a data center facility that may be simulated by the simulation tool discussed above. It is noted that the simulation tool may be used to simulate countless other configurations of data center facilities. The facility includes a data center building 602. As shown, the data center building contains server racks, a raised floor and air conditioning units.

A first water loop 604 and 606 circulates water (or another refrigerant) from a chiller plant 608 to the air conditioning units using a pumping station 610. Thus, cooled water 604 enters the air conditioning units and cools the air in the data center 602. The heated water 606 then passes to the chiller plant 608. The chiller plant 608 using, for example, vapor compression refrigeration cycle, cools the heated water.

The chiller plant 608 interfaces with a condenser water loop 610 and 612. The condenser water loop 610 and 612 includes a pumping station 616 and a cooling tower 614. In the cooling tower 614, heated water 612 is sprayed over a blower 618, causing air 620 to evaporate a portion the heated water 612 and cool it down. The cooled water 610 is then collected and circulated back to the chiller plant 608.

Figure 7:
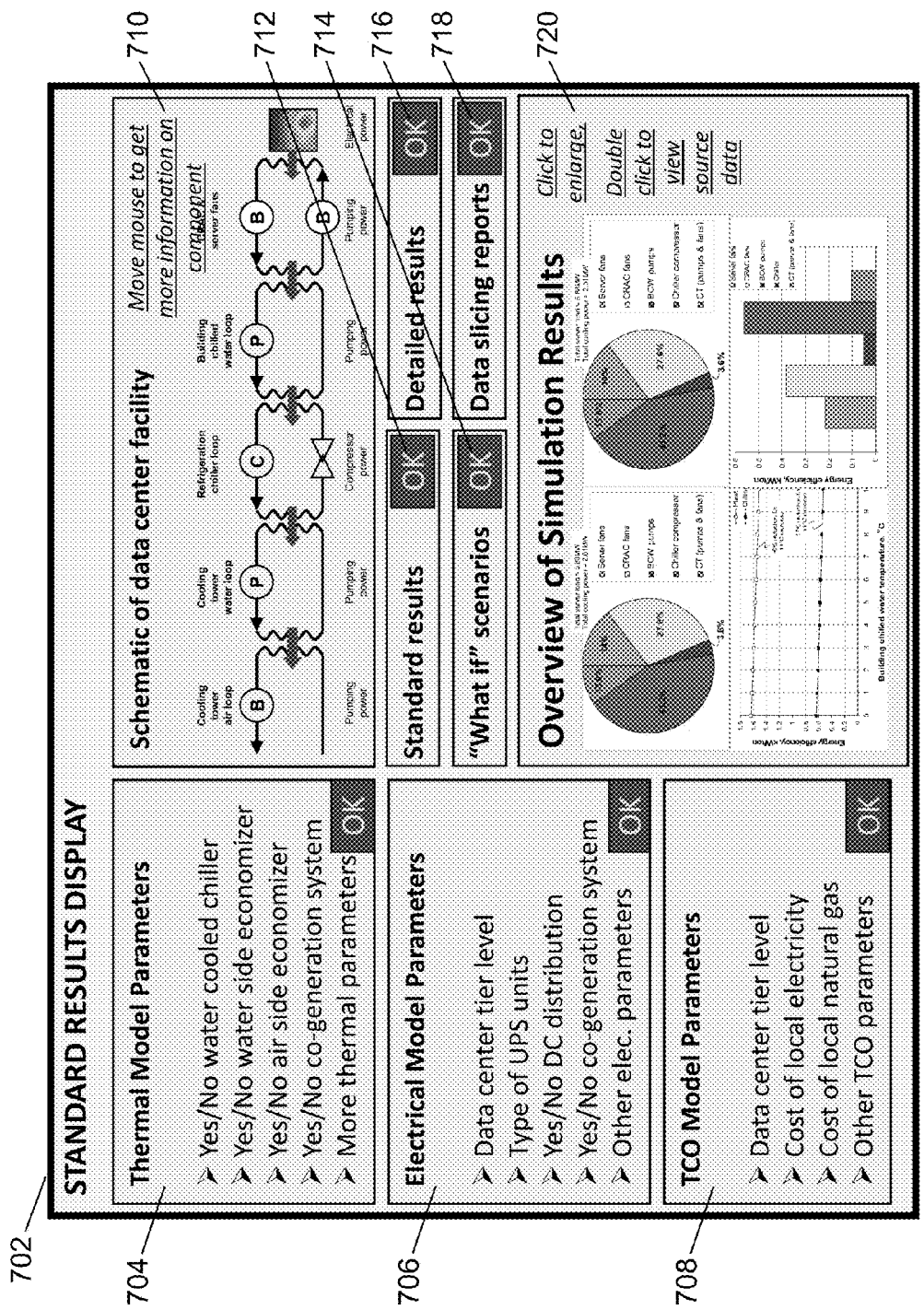
FIG. 7 shows an example of a graphical user interface (GUI) that may be utilized by an embodiment of the present invention to receive component and model parameters from the user to estimate the energy efficiency of a data center over a period of time.

FIG. 7 shows an example user-interface (UI) 702 for a simulator contemplated by the present invention. The user interface 702 includes a schematic section 710. The schematic section 710 displays a power consumption model of the data center facility under simulation. This section provides the user with a visualization of the data center facility being analyzed. As the user enters data center operating parameters, the schematic section 710 is automatically updated to display a representation of current data center configuration.

In the thermal model parameter section 704, facility equipment is selected by the user. For example, the user may indicate whether the data center includes a water cooled chiller, a water side economizer, an air side economizer, and/or a co-generation system. Each selected component is associated with a simulation model. As the user selects the desired equipment, the schematic section 710 is updated to illustrate the selected components. Furthermore, the user may select pre-configured models typical for the geographic location of the data center.

The electrical model parameter section 706 allows the user to indicate the electrical model description. The electrical model parameters section 706 may be used to specify the tier level of the data center. The tier levels correspond to the level of redundancy and availability required in the data center. The models may be, for example, algebraic equations and regression functions representing configurations of data center components and thermal loops. The models may also be created using commercially available tools, such as Matlab.

The total cost of ownership parameter section 708 allows the user to indicate the total cost of ownership model description. These sections are used to calculate the energy consumption and cost of such consumption. The cost of equipment used by the data center may also be specified.

The user interface 702 further includes a simulation results section 720. This portion of the display shows plots of the simulation results.

The "standard results" section 712 allows users to view pre-defined plots of the simulation results. The pre-defined plots of the simulation results may include, for example, a breakdown of the data center expenses by functional unit (IT, cooling, electrical power, etc.), the power loss for specific cooling equipment (chiller, cooling tower, pump etc.), coefficient of performance plots.

The "detailed results" section 716 lets users customize the displayed plots of the simulation results. This section allows users to more closely inspect generated data. The "data slicing" section 718 provides the user with data filtering options. This section can be used, for example, to generate psychrometric charts and yearly histograms.

The scenarios section 714 inputs "what if" scenarios for running different model inputs, as discussed above. The user can use this option to investigate the data center efficiency by varying one or more parameters over a range of values.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the C programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method for estimating the overall energy efficiency of a data center over a period of time by a computer, the method comprising:

receiving one or more time parameters, the time parameters indicating the period of time over which the overall energy efficiency of the data center is estimated;

receiving a plurality of component parameters, the component parameters indicating performance characteristics of data center components and operational interactions between the data center components;

simulating, by a computer processor, the operation and interaction of the data center components based, at least in part, on the component parameters for the period of time over which the energy efficiency is estimated; and outputting results of the simulation, the results indicating the overall energy efficiency of the data center;

wherein receiving the component parameters comprises:

receiving one or more model parameters, the model parameters indicating a data center component model, the data center component model comprising a plurality of data center components configured to operate and interact together;

querying a database of data center component models based on the model parameters, the database of data center component models including information about the performance characteristics and operational interactions of data center components for a plurality of data center component models;

receiving from the database of data center component models the component parameters based on the model parameters.

2. The method of claim 1, wherein simulating the operation and interaction of the data center components comprises:

receiving a plurality of environment parameters, the environment parameters indicating characteristics of an ambient environment over one or more time intervals within the period of time over which the overall energy efficiency is estimated, the characteristics of the ambient environment are selected from at least one of air temperature, air humidity, dew point, atmospheric pressure, and precipitation;

generating a thermodynamic model of heat exchanges resulting from the operational interactions between the data center components and heat exchanges between the data center components and the ambient environment; and utilizing the thermodynamic model to estimate energy consumption by the data center components.

3. The method of claim 2, wherein receiving the environment parameters comprises:

receiving one or more geographical parameters, the geographical parameters including an indication of the geographic location of the data center;

querying a database of environmental information based on the geographical parameters and the period of time over which the overall energy efficiency is estimated, the database of environmental information including information about environmental characteristics for a plurality of geographic locations over one or more time intervals; and receiving from the database of environmental information the environment parameters based on the geographical parameters.

4. The method of claim 1, wherein each of the data center components comprises one or more individual units, the one or more individual units are selected from at least one of air conditioner (AC), computer room air conditioner (CRAC), free cooling unit (FCU), pressurized air plenum, chilled water (CHW) pipe, CHW pipe valve, CHW pump, boosted cold water (BCW) pump, chiller plant, chiller compressor, cooling tower, water side economizer, computer server, network switch, computer server rack, computer server rack fan, uninterruptible power supply (UPS), and electrical co-generation system.

5. The method of claim 1, wherein the performance characteristics of the data center components are selected from at least one of electrical power consumption, natural gas consumption, water consumption, heat generation, heat dissipation, air volume, air pressure, water volume, water pressure, maximum area that can be cooled, and maximum number of floors that can be serviced.

6. The method of claim 1, further comprising:

receiving a plurality of data center parameters, the data center parameters including at least one of number of data center buildings, number of floors, number of server rooms, size of server rooms, maximum server room temperature, and operating hours of data center; and wherein simulating the operation and interaction of the data center components includes determining an optimal data center configuration based on the data center parameters.

7. The method of claim 1, wherein the results of the simulation are selected from at least one of total energy consumption for the data center, energy consumption per data center component, total energy consumption for the data center per time interval in a plurality of time intervals within the time period over which overall energy efficiency is estimated, energy consumption per data center component per time interval in a plurality of time intervals within the time period over which overall energy efficiency is estimated, average server room temperature for the time period over which overall energy efficiency is estimated, and maximum server room temperature for the time period over which overall energy efficiency is estimated.

8. The method of claim 1, further comprising:

receiving a plurality of cost parameters, the cost parameters indicating unit costs of energy resources consumed by the data center, the energy resources are selected from at least one of electrical power, natural gas, and water;

wherein simulating the operation and interaction of the data center components is based, at least in part, on the cost parameters; and wherein the results of the simulation are selected from at least one of total energy cost for the data center, energy cost per data center component, total energy cost for the data center per time interval in a plurality of time intervals within the time period over which overall energy efficiency is estimated, energy cost per data center component per time interval in a plurality of time intervals within the time period over which overall energy efficiency is estimated, and total energy cost per energy resource.

9. The method of claim 1, wherein receiving the component parameters comprises:

receiving one or more data center type parameters, the data center type parameters indicating a data center type, the data center type comprising a plurality of data center components configured to operate and interact together;

querying a database of data center types based on the received data center type parameters, the database of data center types including information about the performance characteristics and operational interactions of data center components for a plurality of data center types;

receiving from the database of data center types the component parameters based on the data center type parameters.

10. The method of claim 1, wherein the method further comprises:

storing intermediate data from simulating the operation and interaction of the data center components, the intermediate data comprising simulation results per data center component per time interval in a plurality of time intervals within the time period over which overall energy efficiency is estimated;

receiving one or more component reporting parameters, the component reporting parameters indicating one or more data center components;

receiving one or more time reporting parameters, the time reporting parameters indicating one or more time intervals within the time period over which overall energy efficiency is estimated; and displaying the stored intermediate data for the received component reporting parameters and the received time reporting parameters.

11. The method of claim 1, wherein the method further comprises:

storing the results of the simulation of the operation and interaction of the data center components in a results database, the results database containing the results of a plurality of simulations of the operation and interaction of the data center components;
receiving one or more simulation reporting parameters indicating one or more simulations of the operation and interaction of the data center components;
querying the results database based on the simulation reporting parameters to retrieve the results of one or more simulations; and
displaying the retrieved results of the one or more simulations.

12. A system for estimating the overall energy efficiency of a data center over a period of time, the system comprising:
a database of environmental information, the database of environmental information configured to store information about environmental characteristics for a plurality of geographic locations and time periods, the environmental characteristics including air temperature, air humidity, and atmospheric pressure;
computer readable memory; and
a computer processor coupled to the computer readable memory, the computer processor configured to:
receive one or more time parameters indicating the period of time over which the overall energy efficiency of the data center needs is estimated;
receive a plurality of environmental parameters, the environmental parameters indicating characteristics of an ambient environment in which the data center operates for the period of time over which the overall energy efficiency is estimated;
receive one or more geographical parameters including an indication of the geographic location of the data center;
query the database of environmental information based on the geographical parameters and the period of time over which the overall energy efficiency is estimated to receive the environment parameters based on the geographical parameters;
generate a thermodynamic model of heat exchanges resulting from the operational interaction between the data center components and heat exchanges between the data center components and the ambient environment;
utilize the thermodynamic model to estimate energy consumption by the data center components;
receive a plurality of component parameters indicating the performance characteristics of data center components and the operational interactions between the data center components;
simulate the operation and interaction of the data center components based, at least in part, on the component parameters for the period of time over which the energy efficiency is estimated; and
output results of the simulation to estimate the overall energy efficiency of the data center.

13. The system of claim 12, wherein the computer processor, in simulating the operation and interaction of the data center components, is further configured to:
generate a thermodynamic model of heat exchanges resulting from the operational interaction between the data center components and heat exchanges between the data center components and the ambient environment; and
utilize the thermodynamic model to estimate energy consumption by the data center components.

14. The system of claim 12, wherein the computer processor, in simulating the operation and interaction of the data center components, is further configured to:
receive a plurality of data center parameters, the data center parameters including at least one of number of data center buildings, number of floors, number of server rooms, size of server rooms, maximum server room temperature, and operating hours of data center; and
determine an optimal data center configuration based on the data center parameters.

15. The system of claim 12, wherein the computer processor is further configured to:
receive a plurality of cost parameters, the cost parameters indicating unit costs of energy resources consumed by the data center, the energy resources are selected from at least one of electrical power, natural gas, and water; and
wherein the computer processor, in simulating the operation and interaction of the data center components, is further configured to use one or more of the cost parameters.

16. The system of claim 12, further comprising:
a database of data center component models, each data center component model comprising a plurality of data center components configured to operate and interact together, the database of data center component models configured to store information about the performance characteristics and operational interactions of data center components for plurality of data center components models; and
wherein the computer processor, in receiving the component parameters, is further configured to receive one or more model parameters indicating a data center component model, and query the database of data center component models based on the model parameters to receive the component parameters.

17. The system of claim 12, further comprising:
a database of data center types, each data center type comprising one or more data center components configured to operate and interact together, the database of data center types configured to store information about the performance characteristics and operational interaction of data center components for a plurality of data center types; and
wherein the computer processor, in receiving the component parameters, is further configured to receive one or more data center type parameters indicating a data center type, and query the database of data center types based on the received data center type parameters to receive the component parameters.

18. The system of claim 12, wherein the computer processor is further configured to:
store intermediate data from simulating the operation and interaction of the data center components in computer memory, the intermediate data comprising simulation results per data center component per time interval in a plurality of time intervals within the time period over which overall energy efficiency is estimated;
receive one or more component reporting parameters, the component reporting parameters indicating one or more data center component;
receive one or more time reporting parameters, the time reporting parameters indicating one or more time intervals within the time period over which overall energy efficiency is estimated; and
display the stored intermediate data for the received component reporting parameters and the received time reporting parameters.

19. The system of claim 12, further comprising:
a results database, the results database configured to store the results of a plurality of simulations of the operation and interaction of the data center components; and
wherein the computer processor is further configured to store the results of the simulation of the operation and interaction of the data center components in the results database, receive one or more simulation reporting parameters indicating one or more simulations of the operation and interaction of the data center components, query the results database based on the simulation reporting parameters to retrieve the results of one or more simulations, and display the retrieved results.

20. A computer program product for estimating the overall energy efficiency of a data center over a period of time, the computer program product comprising:

a non-transitory computer readable storage media having computer readable program code embodied therewith, the computer readable program code configured to:

receive one or more time parameters, the time parameters indicating the period of time over which the overall energy efficiency of the data center needs is estimated;

receive a plurality environmental parameters, the environmental parameters indicating characteristics of an ambient environment in which the data center operates for the period of time over which the overall energy efficiency is estimated;

receive one or more geographical parameters, the geographical parameters including an indication of the geographic location of the data center;

query a database of environmental information based on the geographical parameters and the period of time over which the overall energy efficiency is estimated to receive the environment parameters, the environmental information including air temperature, air humidity, and atmospheric pressure;

receive a plurality of component parameters, the component parameters indicating the performance characteristics of data center components and the operational interaction between the data center components;

simulate the operation and interaction of the data center components based, at least in part, on the component parameters for the period of time over which the overall energy efficiency is estimated; and output results of the simulation to indicate the overall energy efficiency of the data center.

21. The computer program product of claim 20, wherein the computer readable program code to simulate the operation and interaction of the components in the data center includes computer readable program code to:

generate a thermodynamic model of heat exchanges resulting from the operational interaction between the data center components and heat exchanges between the data center components and the ambient environment; and utilize the thermodynamic model to estimate energy consumption by the data center components.

22. The computer program product of claim 20, wherein the computer readable program code to simulate the operation and interaction of the data center components includes computer readable program code to:

receive a plurality of data center parameters, the data center parameters including at least one of number of data center buildings, number of floors, number of server rooms, size of server rooms, maximum server room temperature, and operating hours of data center; and determine an optimal data center configuration based on the data center parameters.

* * * * *